US009182780B2

(12) United States Patent
Wang et al.

(10) Patent No.: US 9,182,780 B2
(45) Date of Patent: Nov. 10, 2015

(54) POWER MANAGEMENT UNIT INCLUDING A SIGNAL PROTECTION CIRCUIT

(75) Inventors: Xuezhen Wang, Fort Collins, CO (US); Russell Radke, Fort Collins, CO (US); Jay E. Ackerman, Fort Collins, CO (US)

(73) Assignee: BROADCOM CORPORATION, Irvine, CA (US)

( * ) Notice: Subject to any disclaimer, the term of this patent is extended or adjusted under 35 U.S.C. 154(b) by 599 days.

(21) Appl. No.: 13/472,842

(22) Filed: May 16, 2012

(65) Prior Publication Data

US 2013/0310115 A1 Nov. 21, 2013

(51) Int. Cl.
*H04B 1/38* (2015.01)
*G06F 1/04* (2006.01)
*G06F 1/26* (2006.01)

(52) U.S. Cl.
CPC . *G06F 1/04* (2013.01); *G06F 1/263* (2013.01)

(58) Field of Classification Search
CPC ........... H03L 7/0995; H03L 5/00; H03L 1/00; H03L 7/099; H03L 7/00; H04W 52/52; H04W 52/04; H04W 52/247; H04W 52/0225; H04W 52/0283; H04W 52/029; H04W 52/02
See application file for complete search history.

(56) References Cited

U.S. PATENT DOCUMENTS

| | | | | |
|---|---|---|---|---|
| 4,107,596 A * | 8/1978 | Weaver et al. | ................. | 323/271 |
| 4,287,535 A * | 9/1981 | Vakil | .............................. | 348/378 |
| 5,878,334 A * | 3/1999 | Talisa et al. | .................... | 455/217 |
| 6,615,060 B1 * | 9/2003 | Usui | .............................. | 455/574 |
| 6,775,531 B1 * | 8/2004 | Kaewell et al. | ............. | 455/343.1 |
| 7,123,600 B2 * | 10/2006 | Ozluturk et al. | .............. | 370/335 |
| 2004/0113709 A1 | 6/2004 | Sibrai et al. | | |
| 2005/0075768 A1 * | 4/2005 | Nicholson et al. | ............... | 701/29 |
| 2005/0128987 A1 * | 6/2005 | Liang | .......................... | 455/234.1 |
| 2007/0237264 A1 * | 10/2007 | Huang et al. | .................... | 375/345 |
| 2012/0290885 A1 * | 11/2012 | Mobin et al. | ..................... | 714/56 |
| 2014/0113709 A1 * | 4/2014 | Walker et al. | ................... | 463/25 |
| 2014/0323044 A1 * | 10/2014 | Kanno et al. | ................. | 455/41.1 |

FOREIGN PATENT DOCUMENTS

| | | |
|---|---|---|
| CN | 1265556 A | 9/2000 |
| CN | 1277752 A | 12/2000 |
| JP | 61065618 A * | 4/1986 |

(Continued)

OTHER PUBLICATIONS

Taiwanese Office Action issued Feb. 2, 2015 in Taiwan Application No. 101147834, 5 pages.

(Continued)

*Primary Examiner* — Lana N Le
(74) *Attorney, Agent, or Firm* — Oblon, McClelland, Maier & Neustadt, L.L.P.

(57) ABSTRACT

The present application discloses various implementations of a power management unit (PMU) suitable for use in a mobile device. In one exemplary implementation, such a PMU includes a gain control block configured to control an oscillator coupled to the PMU. The gain control block is further configured to control a clock output stage of the PMU. The PMU also includes a signal protection circuit coupled to an input of the gain control block. The signal protection circuit is configured to preserve clock signals produced by the clock output stage during a transition to a standby mode.

20 Claims, 4 Drawing Sheets

(56) References Cited

FOREIGN PATENT DOCUMENTS

| KR | 2002065052 | A | * | 8/2002 |
| TW | 201043973 | A | | 12/2010 |

OTHER PUBLICATIONS

Chinese Office Action in patent application No. 201210559286.8 issued Jun. 15, 2015.

* cited by examiner

POWER MANAGEMENT UNIT INCLUDING A SIGNAL PROTECTION CIRCUIT

BACKGROUND

Mobile communication devices, or "mobile devices", are widely used and relied upon for business, personal, and emergency communications. As mobile devices have become more powerful and sophisticated, battery life has become a greater user preoccupation. For example, some modern smartphones may require recharging more than once a day.

Rather than suffer the inconvenience imposed by the need for frequent recharging, a mobile device user may prefer to simply remove and replace a spent or depleted battery. Attempts to accommodate battery replacement include preserving register values of the mobile device by making a transition into a low power standby mode during a pre-determined time interval. It is desirable that the internal clock as well as register values of mobile devices be preserved during an allowed time window for battery replacement.

SUMMARY

The present disclosure is directed to a power management unit including a signal protection circuit, as shown in and/or described in connection with at least one of the figures, and as set forth more completely in the claims.

DETAILED DESCRIPTION

Figure 1:
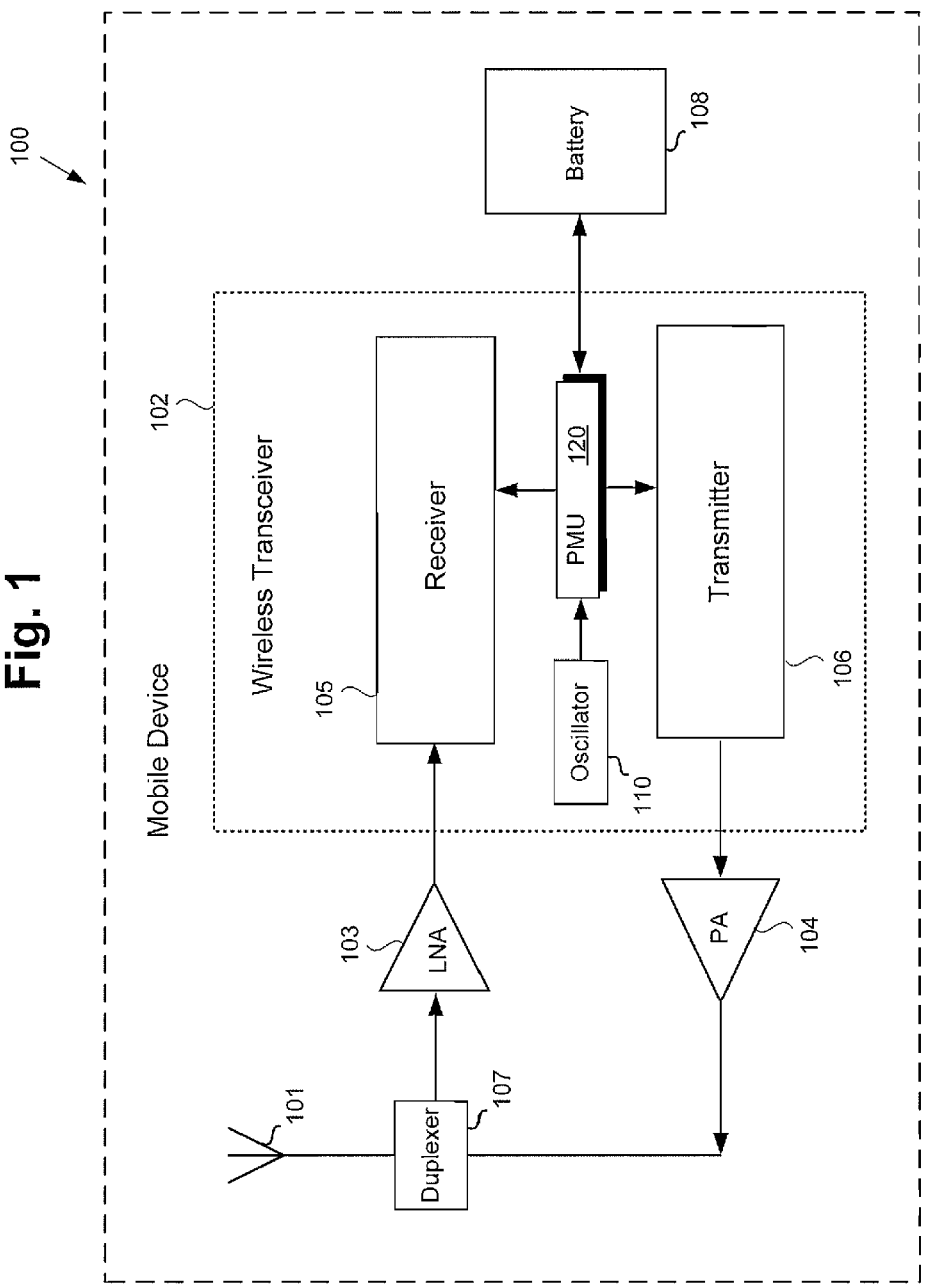
FIG. 1 shows a block diagram of a mobile device including an exemplary power management unit (PMU), according to one implementation.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a block diagram of a mobile device 100 including an exemplary power management unit (PMU) 120, according to one implementation. The PMU 120 is implemented as part of a wireless transceiver 102 of the mobile device 100. In addition to the PMU 120, the wireless transceiver 102 includes a receiver 105, a transmitter 106, and an oscillator 110. The mobile device 100 also includes an antenna 101, a low-noise amplifier (LNA) block 103 coupling the antenna 101 to the receiver 105, and a power amplifier (PA) block 104 coupling the antenna 101 to the transmitter 106. The receiver 105 and the transmitter 106 may be selectably coupled to the antenna 101 using duplexes 107, as shown in FIG. 1. The mobile device 100 is powered using a battery 108, which may be a rechargeable and removable/replaceable battery serving as the principle power source for the mobile device 100.

It is noted that although not explicitly shown as such in FIG. 1, the receiver 105 typically includes mixer circuitry, as well as one or more filtering stages and a digital signal processing (DSP) block. It is further noted that the transmitter 106 will typically include a DSP block and transmit chain processing stages configured to provide preamplification gain control for a transmit signal. Moreover, in other implementations, the mobile device 100 may utilize a transmit/receive (T/R) switch (not shown in FIG. 1) in addition to, or in place of, the duplexer 107. The mobile device 100 may be implemented as a smartphone, cell phone, tablet computer, or an e-book reader. Other exemplary implementations for the mobile device 100 include a digital media player, wireless gaming console, or any other kind of system utilizing a wireless transceiver in modern electronics applications.

Figure 2:
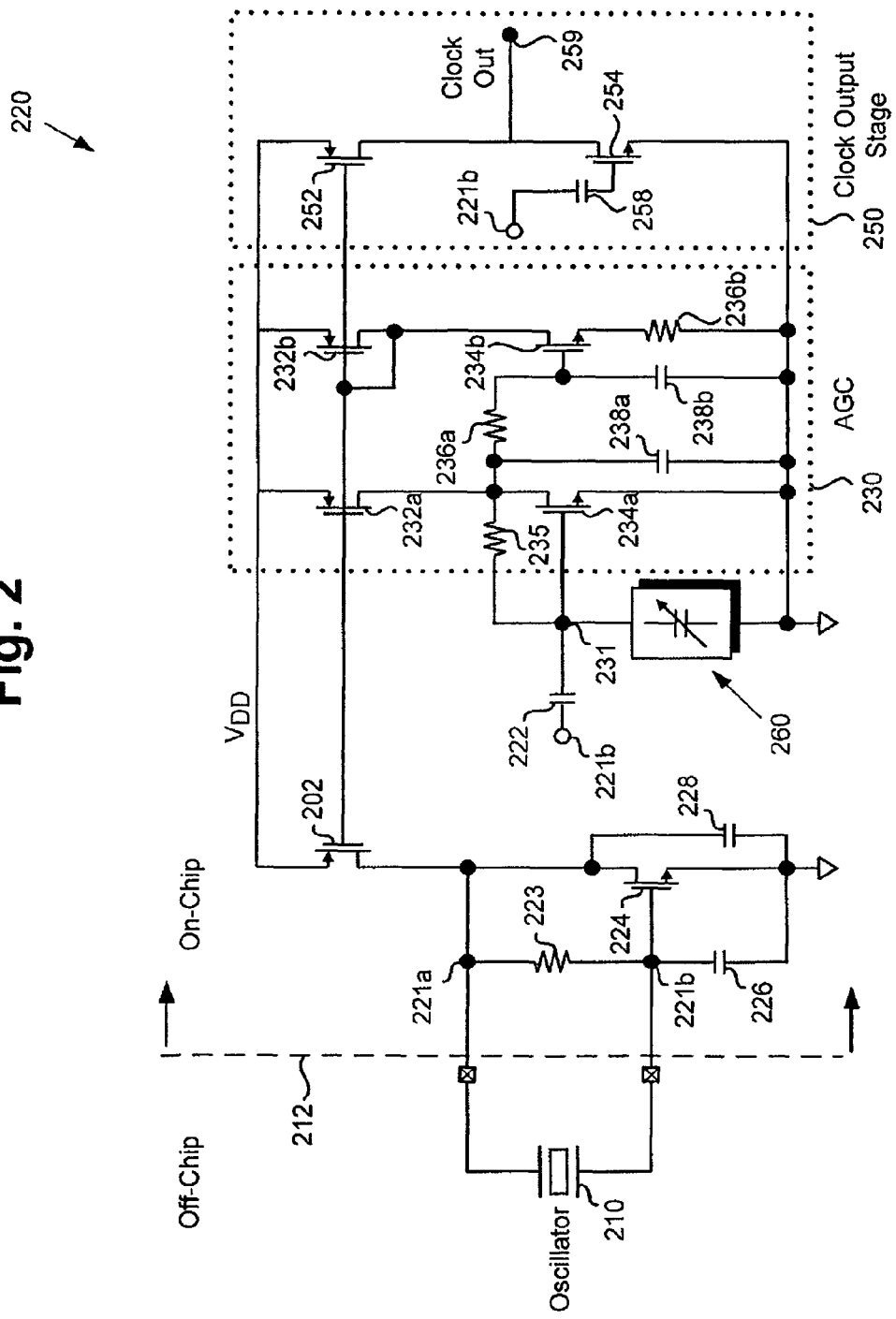
FIG. 2 shows a more detailed diagram of a portion of a PMU including an exemplary implementation of a signal protection circuit.

FIG. 2 shows a more detailed diagram of a portion of a PMU 220 including an exemplary implementation of a signal protection circuit 260. As indicated by chip boundary 212, the PMU 220 is implemented as an integrated circuit (IC) coupled to an off-chip oscillator 210 at the PMU inputs 221a and 221b. The oscillator 210 and the PMU 220 correspond respectively to the oscillator 110 and the PMU 120, in FIG. 1. In other words, the oscillator 210 and the PMU 220 may be implemented as part of a mobile device corresponding to the mobile device 100. It is noted that portions of the PMU 220 not represented in FIG. 2 are coupled to a mobile device battery, corresponding to the coupling of the PMU 120 and the battery 108, as shown by FIG. 1.

The oscillator 210 may be a crystal oscillator, such as a crystal oscillator having a base frequency of approximately 32,768 hertz (Hz), or a lower or higher frequency. For example, the oscillator 210 may be a crystal oscillator producing a higher frequency signal, such as an approximately 1 MHz, 10 MHz, or 100 MHz signal. In still other implementations, the oscillator 210 may be a non-crystal oscillator capable of producing a high frequency signal up to approximately 10 GHz, or higher. Examples of non-crystal oscillators include LC oscillators, coaxial resonator oscillators, and dielectric resonator oscillators. Moreover, when implemented as a non-crystal oscillator, the oscillator 210 may be taken on-chip by the IC including the PMU 220.

The PMU 220 includes transistors 202 and 224, a resistor 223, and capacitors 226 and 228 implemented to drive the oscillator 210. In response, the oscillator 210 produces a substantially pure oscillator signal that is taken on-chip to the PMU 220 by the input 221b. The PMU 220 also includes a gain control block 230, a clock output stage 250, and a signal protection circuit 260 coupled to an input 231 of the gain control block 230. It is noted that each of the gain control block 230, the clock output stage 250, and the signal protection circuit 260 are also coupled to the input 221b receiving the oscillator signal.

The gain control block 230 includes transistors 232a and 232b, transistors 234a and 234b, resistors 235, 236a, and 236b, and capacitors 238a and 238b. As noted above, the input 231 of the gain control block 230 is coupled to the signal protection circuit 260. In addition, the input 231 is coupled to the resistor 235 of the gain control block 230, to a gate of the transistor 234a of the gain control block 230, and through a capacitor 222 to the input 221b.

The clock output stage 250 includes transistors 252 and 254, capacitor 258, and clock output 259. As shown in FIG. 2, the input 221b to the PMU 220 drives a gate of the transistor 254 through the capacitor 258, to produce the clock output 259. It is noted that a current flowing through each of the transistors 202, 232a, and 252 mirror a current flowing through the transistor 232b. As a result, the current flowing through the transistor 232b can control the mirrored currents flowing through the transistors 202 and 252.

Thus, the gain control block 230 is configured to control the oscillator 210. The gain control block 230, which is depicted as an automatic gain control (AGC) block in FIG. 2, is also configured to control the clock output stage 250. The signal protection circuit 260 is coupled to an input 231 of the gain control block 230 and is configured to digitally control the gain control block 230. As a result, the signal protection circuit 260 is configured to preserve clock signals produced by the clock output stage 250 during a transition to a standby mode. As used in the present application, a transition to a standby mode may correspond to any transition from a normal operating mode to a low power mode. Examples of a standby mode include a low or ultra-low power mode, an emergency power conservation mode, and a real-time clock (RTC) mode.

As a specific example of the present inventive principles, the standby mode may be a power conservation mode triggered by removal of the principle battery used to power a mobile device. Referring to FIG. 1, the standby mode may correspond to a low power or ultra-low power mode initiated by the PMU 120 in response to removal of the battery 108. Removal of the battery 108 may occur due to substantial depletion of the battery 108, and may presage insertion of a substantially charged replacement battery as a substitute for the battery 108.

In one implementation, the PMU 120 may be configured to transition the mobile device 100 into a low power or ultra-low power standby mode in order to maintain register values and/or clock functionality when the battery 108 is removed. The standby mode may be implemented to maintain the register values during a pre-determined time interval for replacing the battery 108, such as an approximately sixty (60) second time interval. Moreover, the signal protection circuit is configured to preserve clock signals produced by a clock output stage, such as clock output stage 250, in FIG. 2, during the pre-determined time interval for replacing the battery 108.

As shown in FIG. 2, the signal protection circuit 260 may include a variable capacitor, such as a digitally controlled variable capacitor, coupled between the input 231 of the gain control block 230 and ground. As will be described in greater detail below, the signal protection circuit 260 is configured to limit a rate of change of a gain control block input signal received by the input 231 during the transition to the standby mode. In one implementation, the limitation imposed on the rate of change of the gain control block input signal is based on the time constant of the oscillator 110/210. As known in the art, an oscillator time constant is the time required for the amplitude of oscillations produced by an un-driven oscillator to decay to substantially 1/e its initial value (i.e., approximately thirty-seven percent of its initial value).

Figure 3:
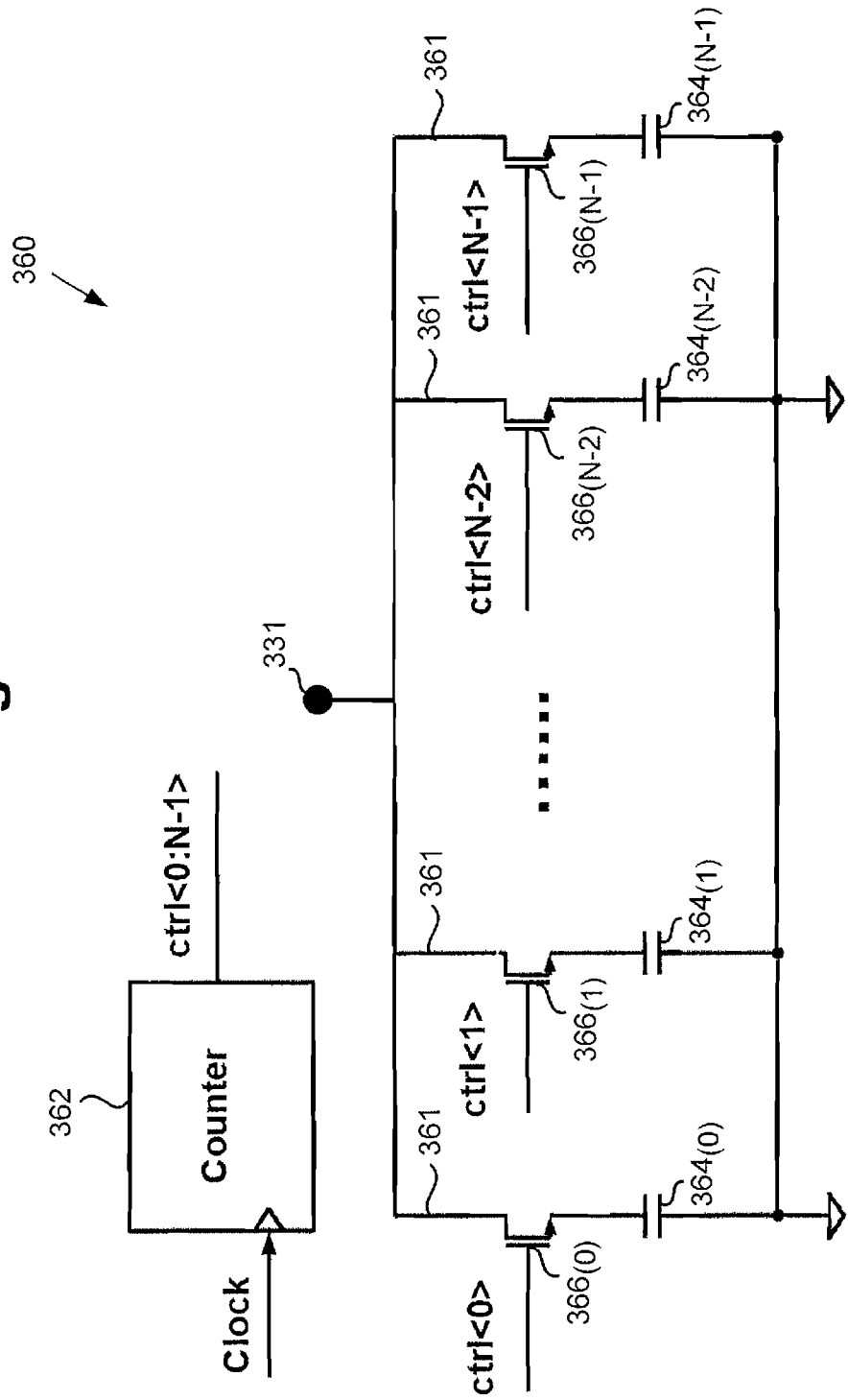
FIG. 3 shows an exemplary implementation of a signal protection circuit for use in a PMU.
Figure 4:
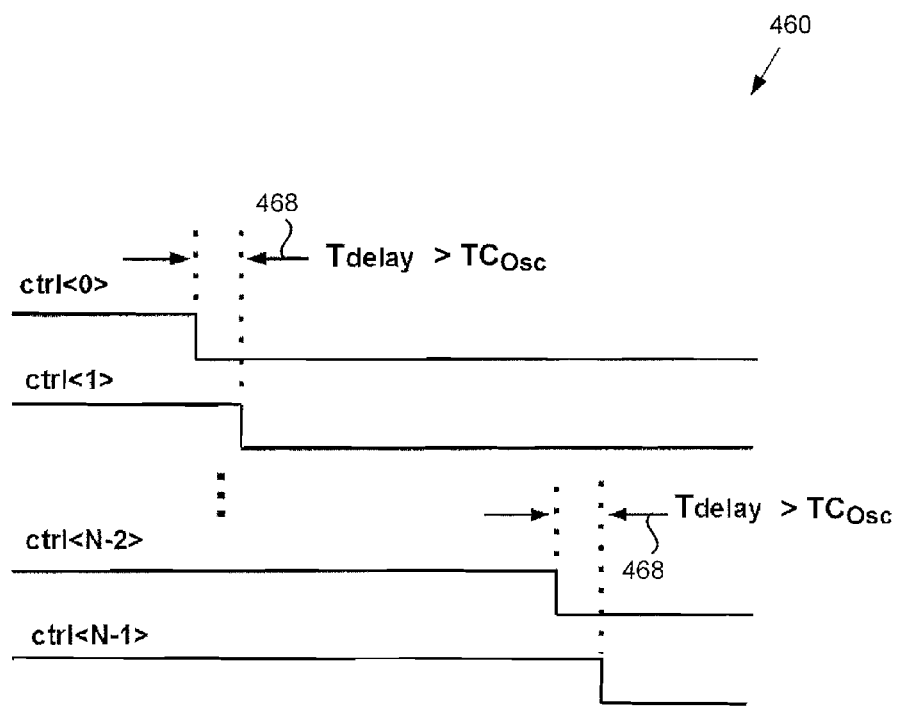
FIG. 4 shows an exemplary timing diagram corresponding to preservation of clock signals during a transition to a standby mode.

The operation of the oscillator 110/210 and the PMU 120/220 will now be described by further reference to FIGS. 3 and 4. FIG. 3 shows an exemplary implementation of a signal protection circuit 360 for use in the PMU 120/220. FIG. 4 shows an exemplary timing diagram 460 corresponding to preservation of clock signals during a transition to a standby mode.

FIG. 3 shows a block diagram of signal protection circuit 360 implemented as a digitally controlled variable capacitor including a network of switchable unit capacitor branches 361 arranged in parallel. Signal protection circuit 360 corresponds to signal protection circuit 260, in FIG. 2. According to the exemplary implementation shown in FIG. 3, signal protection circuit 360 includes a number "N" of the parallel switchable unit capacitor branches 361.

Each of the branches 361 includes a respective unit capacitor $364_{(0)}$, $364_{(1)}$, ..., $364_{(N-2)}$, $364_{(N-1)}$ (hereinafter "unit capacitors $364_{(0)}$-$364_{(N-1)}$"). In addition, each of the branches 361 includes a respective switch $366_{(0)}$, $366_{(1)}$, ..., $366_{(N-2)}$, $366_{(N-1)}$ (hereinafter "switches $366_{(0)}$-$366_{(N-1)}$"). The switches $366_{(0)}$-$366_{(N-1)}$ may be used for switching the respective unit capacitors $364_{(0)}$-$364_{(N-1)}$ into and out of the collective capacitance produced by the network of branches 361. The signal protection circuit 360 also includes a counter 362 configured to provide control signals ctrl<0>, ctrl<1>, ..., ctrl<N-2>, ctrl<N-1> (hereinafter "control signals ctrl<0>-ctrl<N-1>") for selectably turning the respective switches $366_{(0)}$-$366_{(N-1)}$ OFF or ON. Also shown in FIG. 3 is an input 331, corresponding to the input 231 of the gain control block 230, in FIG. 2.

FIG. 4 shows timing diagram 460 corresponding to control of the switches $366_{(0)}$-$366_{(N-1)}$, in FIG. 3, by the counter 362. As shown by FIG. 4, in one implementation, the counter 362 can be configured to gradually turn the switches $366_{(0)}$-$366_{(N-1)}$ OFF, utilizing a delay 468 between each of the successive control signals ctrl<0>-ctrl<N-1>. Moreover, in one implementation, the delay 468 is selected so as to be greater than the time constant of the oscillator 110/210. Thus, the exemplary signal protection circuit 360, shown in FIG. 3, can enable a digitally controlled and graduated transition of the capacitance of the network of branches 361. Such a transition can correspond to a transition to a standby mode by the PMU 120/220. Use of the delay 468 selected to be greater than the time constant of the oscillator 110/220 preserves clock signals produced by the clock output stage 250 during the transition to the standby mode.

By way of example, during a normal operating mode, as opposed to the standby mode, the PMU 120/220 may be configured to keep the mobile device 100 operational using a relatively higher current to ensure good jitter performance. In such a normal operating mode, the amplitude of the gain control block input signal is typically attenuated with respect to the oscillator signal received at the PMU input 221b. That attenuation of the signal at input 231 is produced by the voltage divider formed by capacitor 222 and the capacitance provided by the signal protection circuit 260. If, for example, the capacitance of the capacitor 222 is C and the normal operating mode capacitance of the signal protection circuit 260 is 9C, the oscillator signal at the input 221b is reduced by approximately tenfold (1/10) at the input 231.

In the lower power standby mode, it is desirable to operate the PMU using a reduced current to substantially minimize power consumption. A transition from the normal operating mode to the standby mode can be achieved by increasing the amplitude of the gain control block input signal received at the input 231. However, the gain control block 230 is configured to respond to changes in the gain control block input signal so as to stabilize the performance of the oscillator 210. As a result, a large and/or sudden increase in the gain control block input signal can be expected to trigger a significant corrective response by the gain control block 230. If not properly mitigated, the corrective response by the gain control circuit 230 can have potentially undesirable consequences for the performance of the clock output stage 250.

Continuing with the example capacitances introduced above, the capacitor 222 has capacitance C and the signal protection circuit 260 has a normal operating mode capacitance of 9C. The abrupt switching out of the capacitance provided by the signal protection circuit 260 would cause the gain control block input signal at the input 231 to increase by a factor of approximately ten.

As shown by FIG. 2, the gain control block input signal received at input 231 drives the gate of the transistor 234a. The sudden increase in the amplitude of the driving signal for the transistor 234a will pull the gate of the transistor 234b LOW, turning the transistor 234b OFF. That, in turn, causes the transistor 232b, implemented as a PMOS transistor, to turn OFF as well. Moreover, because the transistors 202, 232a, and 252, also implemented as PMOS transistors, mirror the transistor 232b, the transistors 202, 232a, and 252 are also turned OFF. As a result, the clock output stage 250 can be temporarily disabled as a result of an abrupt increase in the gain control block input signal received at the input 231.

Even temporarily disabling the clock output stage 250 can result in the loss of one or more of the clock signals produced by the clock output stage 250 and relied upon by the PMU 220, as well as other sub-systems of the mobile device 100. In order to preserve the clock signals produced by the clock output stage 250 during the transition to the standby mode, signal protection circuit 260 limits the rate of change of the gain control block input signal. Such a result can be accomplished in a variety of ways. In one implementation, the rate of change of the gain control input signal is limited, and the clock signals produced by the clock output stage 250 are preserved, by gradually reducing the collective capacitance of the signal protection circuit 360.

As shown by FIGS. 3 and 4, when the transition to the standby mode is initiated, a shutdown control signal ctrl<0> causes the unit capacitor $364_{(0)}$ to be switched out of the capacitor network of the signal protection circuit 360 by its respective switch $366_{(0)}$. As a result, the control signal ctrl<0> results in an incremental decrease in the capacitance provided by the signal protection circuit 360. That incremental reduction in the capacitance of the signal protection circuit 360 causes a corresponding incremental increase in the gain control block input signal at the input 231/331.

After a first delay 468, the shutdown control signal ctrl<1> causes the unit capacitor $364_{(1)}$ to be switched out of the capacitor network of the signal protection circuit 360 as well. Thereafter, the remaining unit capacitors are switched out one-by-one after additional respective delays 468. After "N" such delays 468, all of the unit capacitors $364_{(0)}$-$364_{(N-1)}$ are switched out and the transition to the standby mode is complete.

Through appropriate selection of the value of the unit capacitors $364_{(0)}$-$364_{(N-1)}$ and the delay 468, the transition to the standby mode can be optimized so as to occur as rapidly as possible while preserving the clock signals produced by the clock output stage 250. One possible constraint on these parameters is introduced by the time constant of the oscillator 110/210. Consequently, in one implementation, the delay 468 is selected such that it is greater than the time constant of the oscillator 110/210.

It is noted that although the present concepts have focused on the transition to the standby mode, the signal protection circuit 260/360 can also be utilized to produce a graduated transition from the standby mode to the normal operating mode, if desired. For example, one or more of the unit capacitors $364_{(0)}$-$364_{(N-1)}$ may be concurrently switched in to the capacitor network shown in FIG. 3 during a transition to the normal operating mode. Such a transition may be governed by delay 468, or by another delay interval optimized for a return to higher current operation. Moreover, in one implementation, it may be desirable to return to the normal operating mode without utilizing a delay such as the delay 468. In that implementation, all or substantially all of the unit capacitors $364_{(0)}$-$364_{(N-1)}$ may be switched into the signal protection circuit 360 concurrently.

Due to the advantageous concepts and designs disclosed in the present application, instead of having to frequently recharge a mobile device, such as a smartphone, a user may simply remove and replace a spent or depleted battery. Such replacement can be accomplished without erasing register values, such as alarm or timer settings. Moreover, clock signals produced by an internal clock of the mobile device are not lost during the transition to the low power standby mode.

That is to say, the present application discloses a signal protection circuit configured to preserve clock signals during a transition to a standby mode. By configuring such a signal protection circuit to digitally control a gain control loop, implementations of the present solution enable a graduated transition from a normal operating mode to the standby mode. In addition, by limiting the rate of change of a gain control loop input signal, implementations of the present solution prevent a clock output stage controlled by the gain control loop from being disabled during the transition to the standby mode. As a result, the signal protection circuit disclosed by the present application enables reliable and continuous clock functionality during the transition to the standby mode.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An electronic device comprising:
   gain control circuitry configured to control an oscillator coupled to said gain circuitry and to control a clock output stage; and
   a signal protection circuit coupled to an input of said gain control circuitry and configured to preserve clock signals produced by said clock output stage during a transition to a standby mode by limiting a rate of change of a gain control circuitry input signal received by said input of said gain control circuitry during said transition to said standby mode.

2. The electronic device of claim 1, wherein said oscillator is a crystal oscillator.

3. The electronic device of claim 1, wherein said gain control circuitry comprises automatic gain control (AGC) circuitry.

4. The electronic device of claim 1, wherein said signal protection circuit comprises a digitally controlled variable capacitor coupled between said input of said gain control circuitry and ground.

5. The electronic device of claim 1, wherein said rate of change of said gain control circuitry input signal is limited based on a time constant of said oscillator.

6. The electronic device of claim 1, further comprising:
   a battery.

7. The electronic device of claim 6, wherein said standby mode is configured to be maintained during a predetermined time interval for replacing said battery.

8. The electronic device of claim 1, wherein the electronic device is a mobile communication terminal.

9. The electronic device of claim 1, wherein said signal protection circuit is implemented as part of a power management unit (PMU) of said electronic device.

10. The electronic device of claim 1, wherein said electronic device is a mobile terminal comprising a battery.

11. The electronic device of claim 10, wherein said standby mode is configured to be maintained during a predetermined time interval for replacing said battery.

12. A power management unit (PMU) comprising:
 automatic gain control (AGC) circuitry configured to control an oscillator coupled to said PMU and to control a clock output stage;
 a signal protection circuit coupled to an input of said AGC circuitry and configured to preserve clock signals produced by said clock output stage during a transition to a standby mode by limiting a rate of change of an AGC circuitry input signal received by an input of said AGC circuitry during said transition to a standby mode.

13. The PMU of claim 12, wherein said oscillator is a crystal oscillator.

14. The PMU of claim 12, wherein said signal protection circuit comprises a digitally controlled variable capacitor.

15. The PMU of claim 14, wherein said digitally controlled variable capacitor is coupled between said input of said AGC circuitry and ground.

16. The PMU of claim 12, wherein said rate of change of said AGC circuitry input signal is limited based on a time constant of said oscillator.

17. The PMU of claim 12, wherein said PMU is implemented as part of a wireless transceiver.

18. An electronic device comprising:
 a signal protection circuit coupled to an input of gain control circuitry and configured to preserve clock signals produced by a clock output stage controlled by the gain control circuitry during a transition to a standby mode by limiting a rate of change of a gain control circuitry input signal received by said input of said gain control circuitry during said transition to said standby mode.

19. The electronic device of claim 18, wherein said signal protection circuit comprises a digitally controlled variable capacitor coupled between said input of said gain control circuitry and ground.

20. The electronic device of claim 18, wherein said rate of change of said gain control circuitry input signal is limited based on a time constant of an oscillator controlled by said gain control circuitry.

* * * * *